United States Patent
Uekert et al.

(10) Patent No.: US 7,700,891 B2
(45) Date of Patent: Apr. 20, 2010

(54) PROCESS FOR HANDLING SEMICONDUCTOR DEVICES AND TRANSPORT MEDIA IN AUTOMATED SORTING EQUIPMENT

(75) Inventors: Kenneth B. Uekert, Ramona, CA (US); Samer Kabbani, Carlsbad, CA (US); Larry Stuckey, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 767 days.

(21) Appl. No.: 11/392,952

(22) Filed: Mar. 30, 2006
(Under 37 CFR 1.47)

(65) Prior Publication Data
US 2007/0007946 A1    Jan. 11, 2007

Related U.S. Application Data

(60) Provisional application No. 60/666,196, filed on Mar. 30, 2005.

(51) Int. Cl.
*B07C 5/344* (2006.01)
(52) U.S. Cl. ................... 209/573; 209/571
(58) Field of Classification Search .............. 209/556, 209/571, 573, 933; 414/404, 810, 222.07, 414/226.05; 700/213, 219, 223
See application file for complete search history.

(56) References Cited

U.S. PATENT DOCUMENTS

| 5,313,156 | A | 5/1994 | Klug et al. |
| 6,222,145 | B1 | 4/2001 | Cook et al. |
| 6,227,373 | B1 * | 5/2001 | Stuckey et al. ............... 209/3.1 |
| 6,239,396 | B1 | 5/2001 | Kang |
| 6,248,967 | B1 | 6/2001 | Nakamura |

* cited by examiner

*Primary Examiner*—Patrick H Mackey
*Assistant Examiner*—Mark Hageman
(74) *Attorney, Agent, or Firm*—Foley & Lardner LLP (57) ABSTRACT

A method for sorting devices in automated handling equipment, including placing a plurality of input trays containing a plurality of devices and a plurality of empty trays into a handler; sorting the plurality of devices in the plurality of input trays into the plurality of empty trays according to a category of each of the plurality of devices, dynamically assigning categories to each of the plurality of empty trays for each category of the plurality of devices, dynamically assigning categories to the plurality of input trays and placing the sorted plurality of devices into the plurality of input trays, removing the empty trays housing the plurality of sorted devices from the handler and determining whether the sorting is completed.

5 Claims, 8 Drawing Sheets

FIG. 8

PROCESS FOR HANDLING SEMICONDUCTOR DEVICES AND TRANSPORT MEDIA IN AUTOMATED SORTING EQUIPMENT

CROSS-REFERENCE TO RELATED PATENT APPLICATIONS

This instant application claims priority to and benefit of U.S. Provisional Application 60/666,196 filed Mar. 30, 2005 the disclosure of which is incorporated by reference herein in its entirety.

FIELD OF INVENTION

The present invention relates generally to a sorting control process. More particularly, it relates to a sort control process for automated processing equipment.

BACKGROUND OF THE INVENTION

Figure 1:
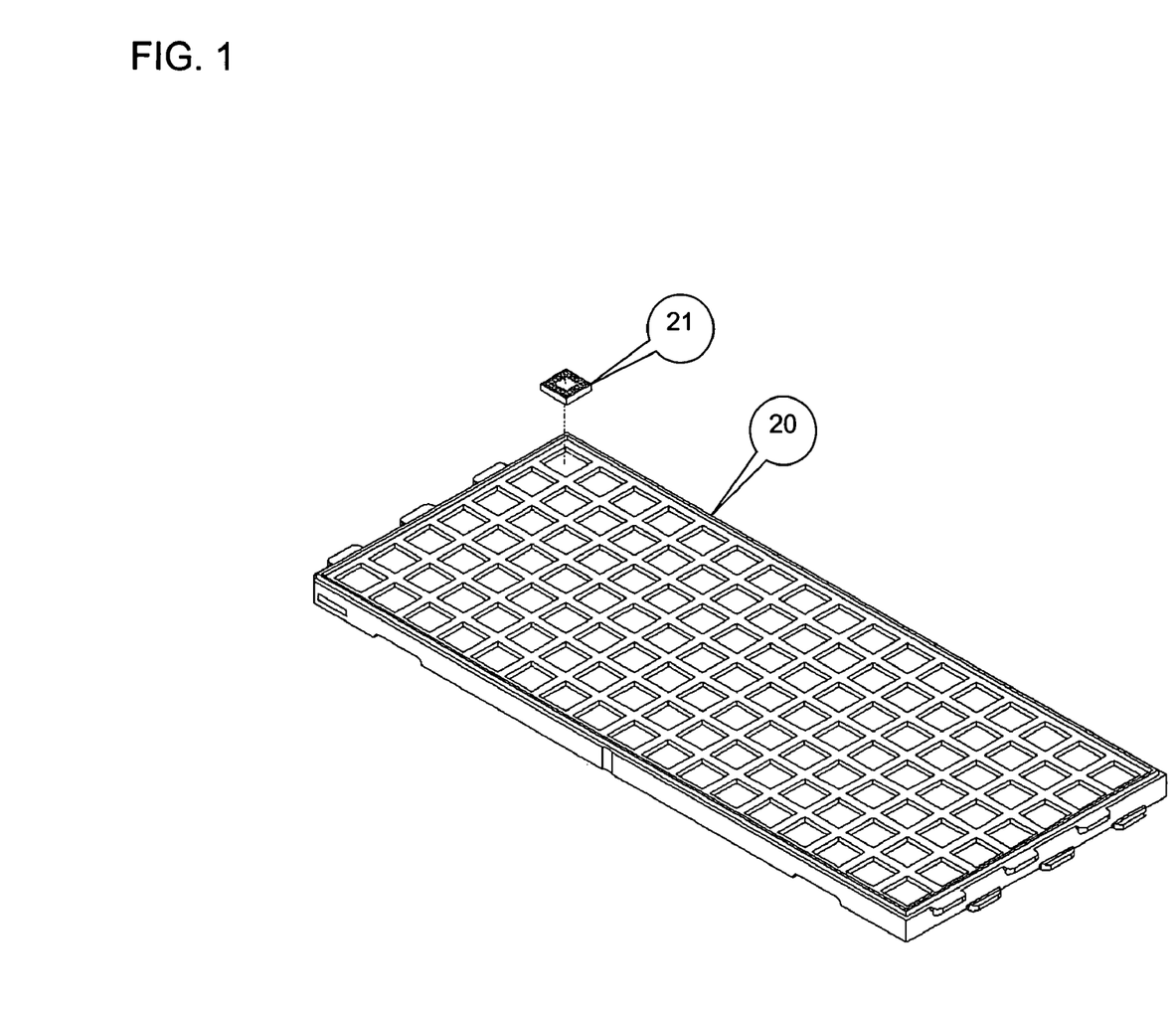
FIG. 1 is a perspective view of a media tray used for device transport.

Semiconductor devices are commonly sorted into different categories based on performance characteristics determined during test by specialized automated processing equipment. Transport media include any fixture or carrier designed for transporting semiconductor devices internal or external to the automated processing equipment. An example is a plastic tray as specified by the JEDEC Design Standard. FIG. 1 is an illustration of a transport media 20 suitable for carrying a plurality of devices 21.

Automated handling equipment used to sort semiconductor devices into trays are generally referred to as automated handling equipment or binning handlers. Binning handlers facilitate the identification and sorting of devices by category. A device may be categorized based on a number of characteristics including, for example, processor speed. Binning handlers group devices of similar categories (e.g. processor speed) together after testing for further processing. Generally, for each category of device being sorted, binning handlers require each tray to be held in an individual tray station. These handlers use fixed or assigned tray stations to support and locate trays into which semiconductor devices are sorted. For each category of device being sorted there must be an individual tray station. Thus the dimensions of the binning handler increase in direct proportion to the number of device categories desired.

In view of the foregoing, a sort control process is needed which allows trays and devices to be dynamically assigned and sorted for optimum speed and flexibility. More particularly, it would be desirable to provide a sort control process that would assign trays to a desired category without delaying the device sorting process. Further, it would be desirable for the sort control process to allow the devices to be sorted into more categories than there are tray locations available inside a binning handler.

SUMMARY OF THE INVENTION

According to one embodiment of the invention, a method for sorting devices in automated handling equipment comprises placing a plurality of input trays, containing a plurality of devices, and a plurality of output trays into a binning handler, assigning categories to each of the plurality of output trays for each category of the plurality of devices, sorting the plurality of devices in the plurality of input trays into the plurality of output trays according to a category of each of the plurality of devices, assigning categories to the plurality of input trays, placing the sorted plurality of devices into the plurality of input trays, removing the output trays housing the plurality of sorted devices from the binning handler and determining whether another empty tray is needed.

According to still another embodiment of the invention, a method for sorting devices in automated handling equipment comprises placing a plurality of output trays and a plurality of input trays containing a plurality of devices into a binning handler, assigning categories to each of the plurality of output trays for each category of the plurality of devices and sorting the plurality of devices in the plurality of input trays into the plurality of output trays according to a category for each of the plurality of devices. If the number of categories of devices is greater than a preset value the method assigns an output tray to become a mixed tray, places the plurality of devices in the mixed tray based on each of the plurality of devices' categories, removes the full output trays housing the plurality of sorted devices from the handler and determines whether the sorting of the plurality of devices in categories less than the preset value are complete. If the sorting of the plurality of devices in categories less than the preset value is complete the method places a plurality of empty output trays into the handler, assigns categories to the empty output trays corresponding to the categories of the plurality of devices housed in the mixed trays and sorts the plurality of devices in the plurality of mixed trays into the plurality of empty output trays.

It is to be understood that both the foregoing general description and the following detailed description are exemplary and explanatory only, and are not restrictive of the invention as claimed.

BRIEF DESCRIPTION OF THE DRAWINGS

These and other features, aspects and advantages of the present invention will become apparent from the following description, appended claims, and the accompanying exemplary embodiments shown in the drawings, which are briefly described below.

DETAILED DESCRIPTION OF THE PREFERRED EMBODIMENTS

Embodiments of the present invention will be described below with reference to the accompanying drawings. It should be understood that the following description is intended to describe exemplary embodiments of the invention, and not to limit the invention.

Figures 2A, 2B:
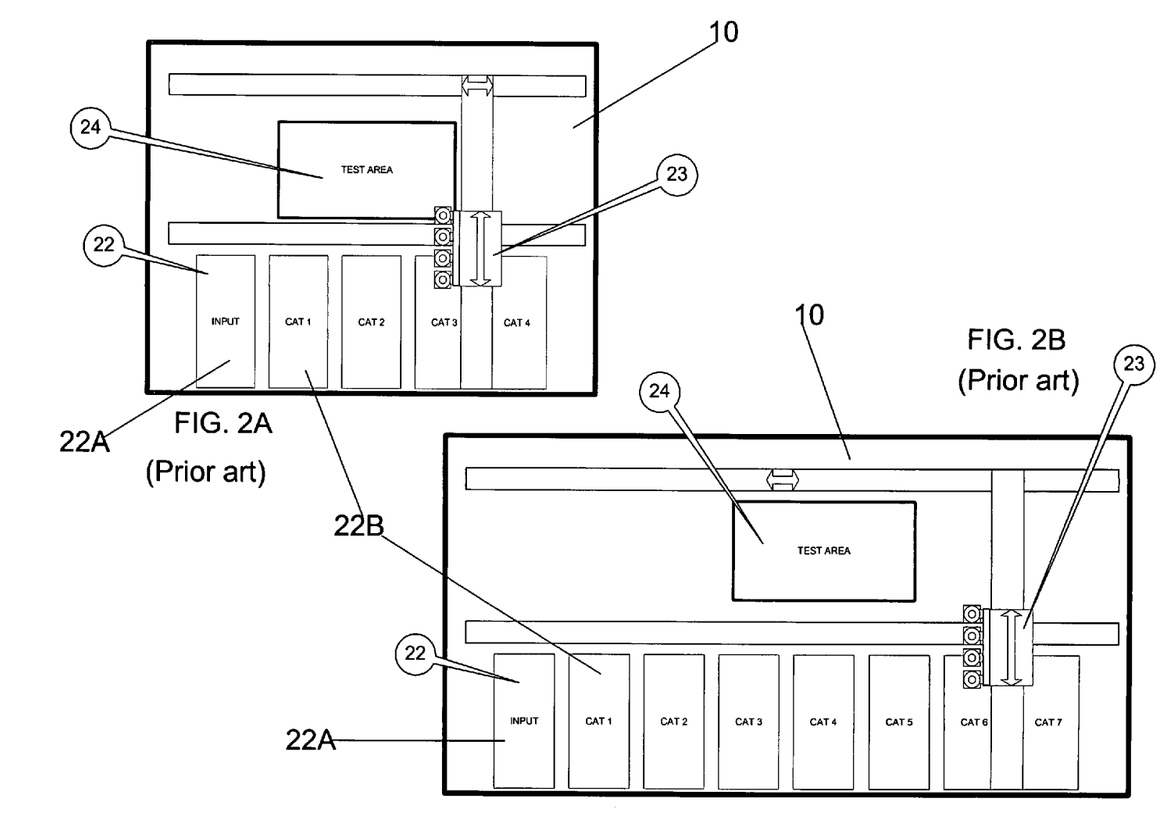
FIGS. 2A and 2B are top views of two binning handlers with different category capacities according to the prior art.

As shown in FIGS. 2A and 2B, current binning handlers 10 typically consist of a plurality of fixed tray stations 22, a device handling mechanism 23 and a test area 24 along with various other mechanisms. A standard sort process operates as follows: Untested devices are placed in the input tray 22A. After testing, the devices are sorted by category and placed in the appropriate category tray 22B by the device handling mechanism 23. Binning handlers using a standard sort process require a tray location for each device category to be sorted. As shown in FIGS. 2A and 2B, the size of a conventional binning handler 10 increases with the number of fixed stations 22 allocated for categorization. Thus, the binning handler 10 with seven category stations FIG. 2B will be larger than the binning handler with 4 category stations FIG. 2A.

Figure 3:
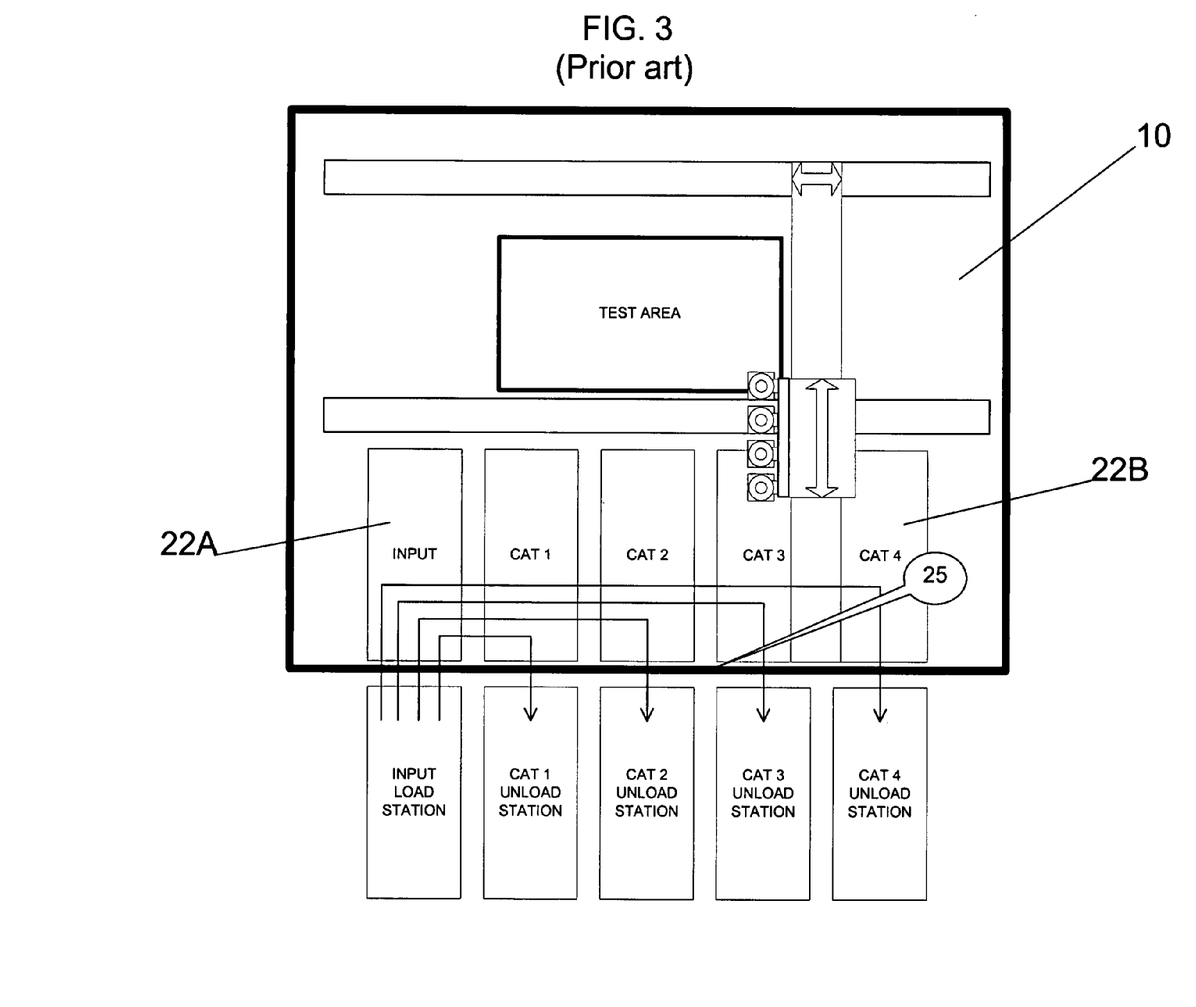
FIG. 3 is a top view of a binning handler with external input and output mechanisms according to the prior art.

In addition to transporting media within a binning handler 10, current binning handlers 10 move transport media into and out of the system. This function allows an operator to load and unload trays and/or devices. FIG. 3 shows a binning handler 10 having an external load and unload mechanism 25 and a typical path for the transport media during a sorting process. As shown in FIG. 3, categories are pre-assigned to the category tray stations 22B. Referring to FIG. 3, if a fifth category of a device were identified a new category tray station is needed. This requires the removal of an existing category tray and the addition of another category tray. Such an exchange may result in significant processing delays.

The system and method of the present invention described herein may be advantageously used inside binning handlers to control tray and device movement. A binning handler, using the process and equipped with the required mechanical subsystems according to the present invention is capable of moving trays into or out of any tray station 22 desired and moving trays into or out of any external module as desired.

Figure 4:
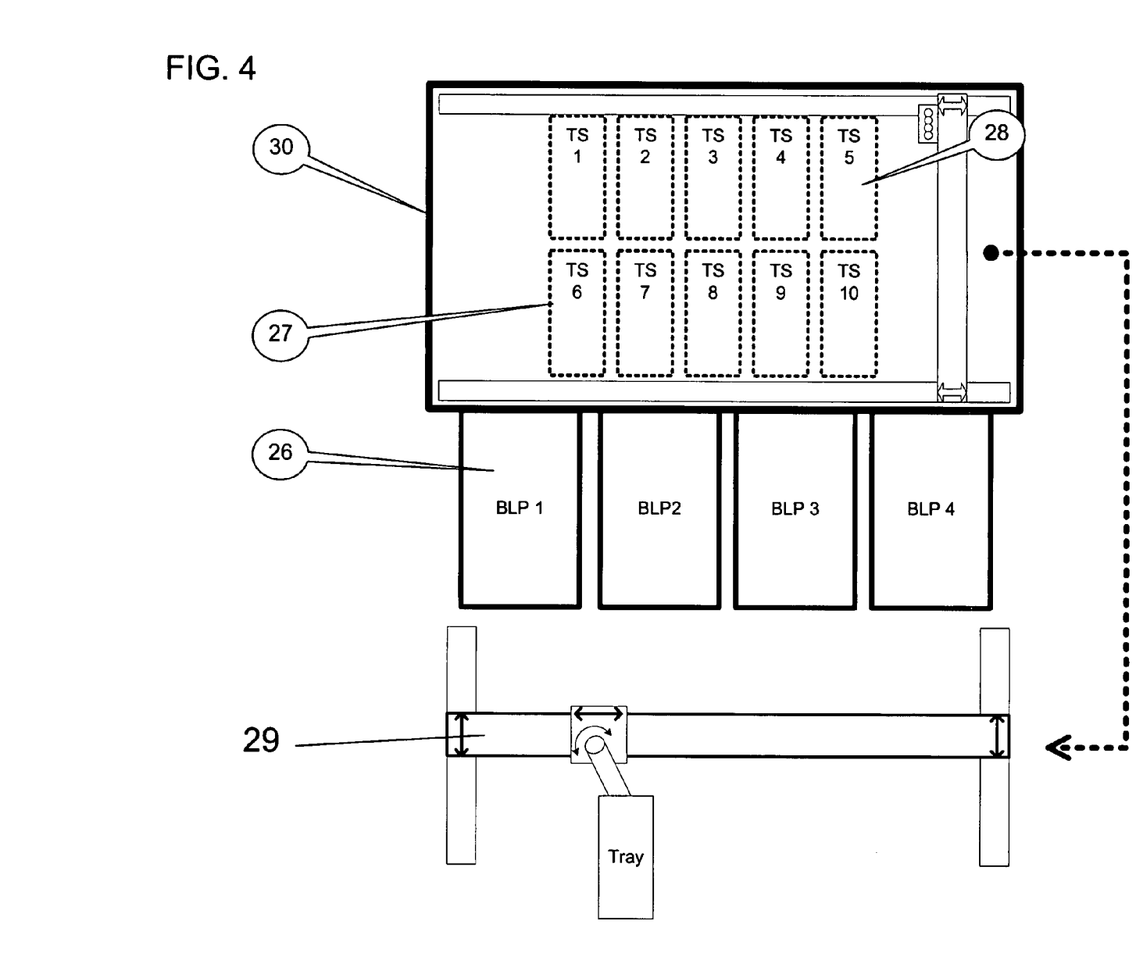
FIG. 4 is a top view of an off-line binning handler system configured to execute the sort control processing according to one embodiment of the present invention.

FIG. 4 shows a top view of a binning handler capable of implementing a sort control process according to one embodiment of the present invention. The binning handler has a plurality of external modules called Binning Load Ports (BLP) 26 capable of inputting and outputting trays to and from the handler or an operator. The BLPs 26 are also capable of accepting trays of multiple categories and keeping the tray categories segregated from each other. Tray stations 27 are shown in FIG. 4 and are labeled TS1-TS10. Devices are moved through the system via an overhead pick and place mechanism 28. Trays are moved through the system via a tray transport mechanism 29 configured to move under the trays. In FIG. 4 the transport mechanism 29 is shown outside the handler for clarity, but actually may exist inside the handler framework 30.

Figure 5:
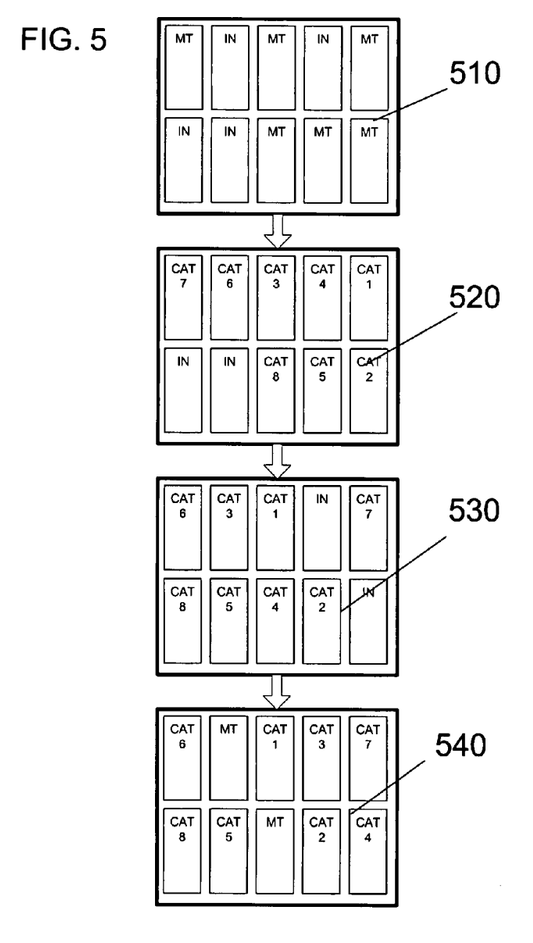
FIG. 5 is a block/flow diagram illustrating tray movement within the offline binning handler during the sort control process according to one embodiment of the present invention.

Tray motion as executed by the sort control process is shown in FIG. 5 and will be described with reference to FIG. 7. As shown in FIG. 5, only ten available tray stations 27 are shown. For illustration purposes only, trays are labeled with "In" for a tray with input devices of various categories, "MT" for an empty tray, or "Cat#" where "#" is the category number of devices being loaded into the tray.

First, trays containing unsorted devices are input into the binning handler from the BLPs 26 via the tray transport mechanism 29 and placed such that transport time of the trays is minimized (step 710). The step labeled 510 in FIG. 5 shows an exemplary configuration of a series of tray stations after step 710 is complete.

Devices residing in the input trays are sorted out into output trays of specific category via the overhead pick and place mechanism (step 720). Trays are dynamically assigned categories as device categories are identified and the pick and place mechanism 28 places the devices into an output tray corresponding to the device category. (step 730). The step labeled 520 in FIG. 5 shows an exemplary configuration of a series of trays after step 730 is complete.

If more device categories are needed, input trays that are in the process of being emptied will be dynamically assigned a new category and eventually will become output trays (step 750). Once no new categories are needed empty input trays are returned to one of the BLPs 26. Similarly, as output trays become full they will be removed from the handler and placed into the BLP 26 (step 760). The step labeled 530 in FIG. 5 is exemplary of the dynamic change in tray stations that may occur during steps 750 and 760.

A shown in step 770, the method will determine whether the sorting is completed. If not, another empty tray and/or another input tray are input into the system and the sorting process continues. If sorting is complete, then the remainder of the output trays are placed into the BLPs 26. (step 770). Step 540 is an exemplary representation of a series of tray stations after sorting is complete but before the output trays are transferred to the BLPs 26.

Figure 6:
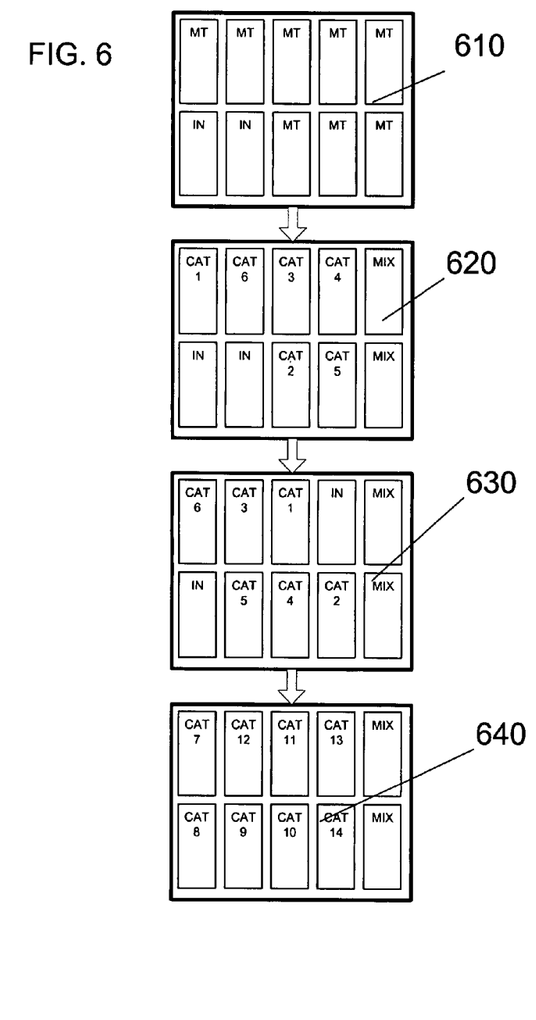
FIG. 6 is a block/flow diagram illustrating tray movement within the offline binning handler during the sort control process according to one embodiment of the present invention.
Figure 7:
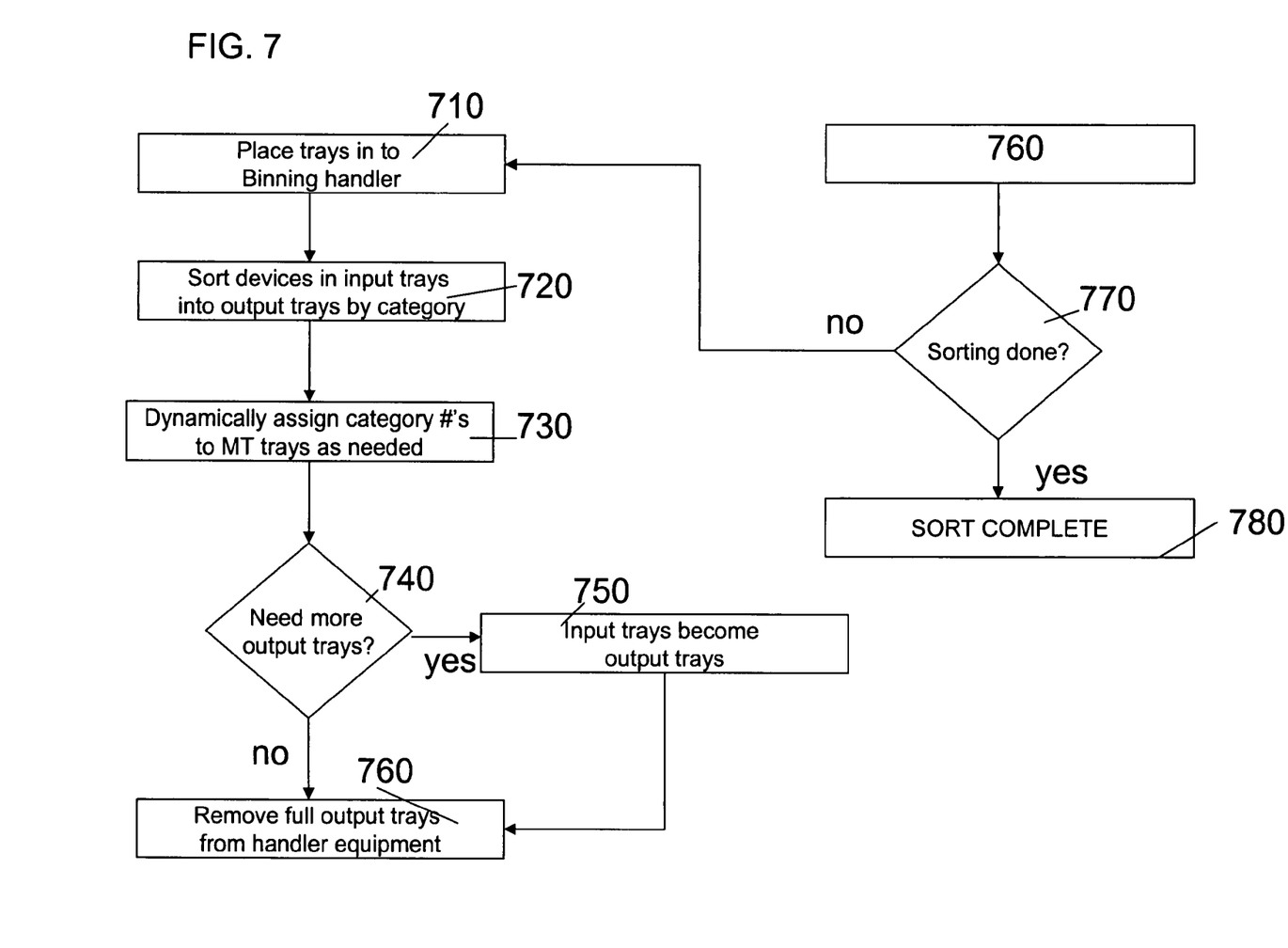
FIG. 7 is a flow chart of the sort control process according to one embodiment of the present invention.
Figure 8:
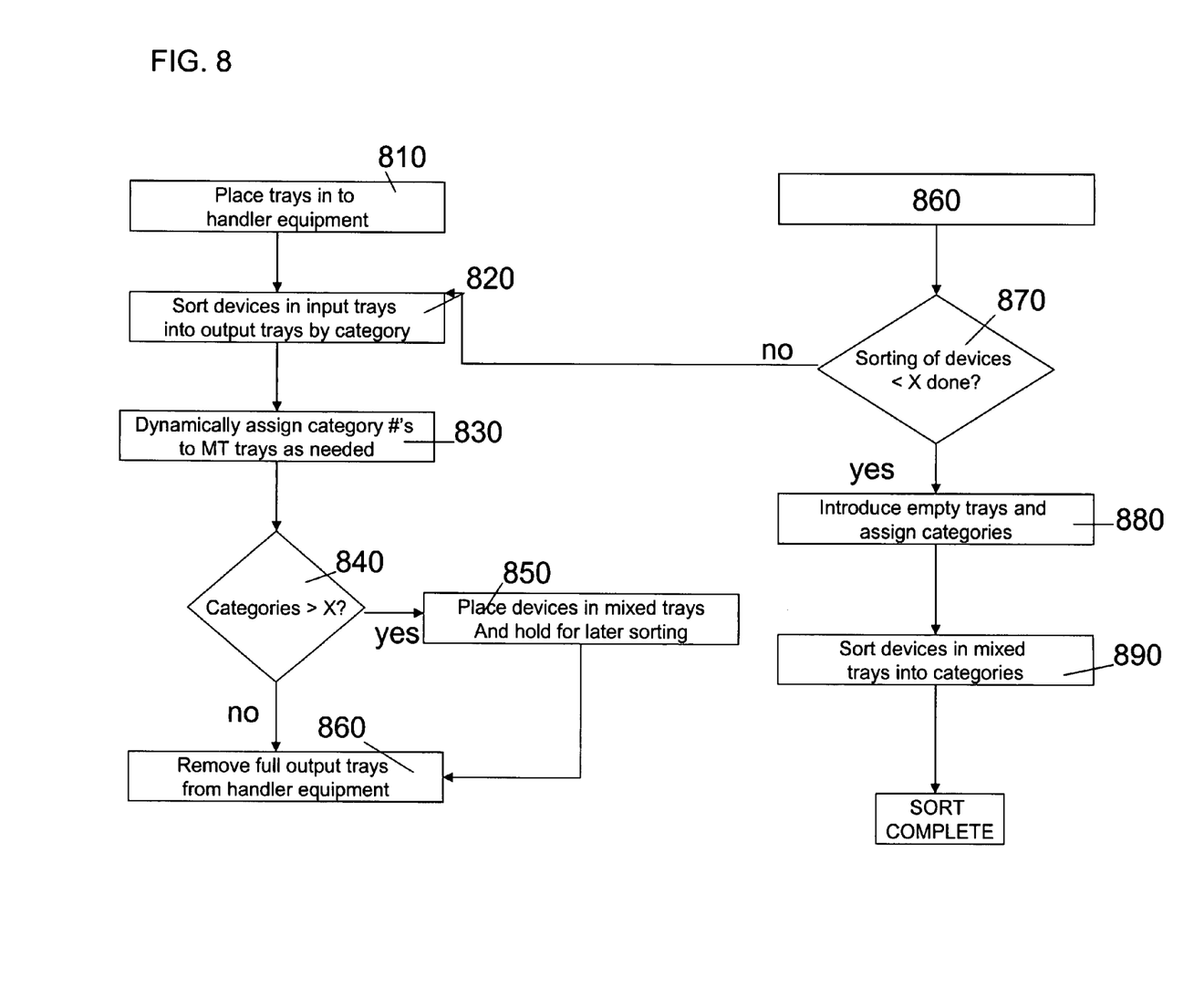
FIG. 8 is a flow chart of the sort control process according to one embodiment of the present invention.

According to one embodiment of the invention, FIGS. 5 and 7 demonstrate how tray motion and dynamic assignment of categories is accomplished in a binning handler. According to another embodiment of the invention, FIGS. 6 and 8 illustrate how the present invention can provide more sort categories than there are tray locations inside the binning handler.

First, input trays and empty output trays are input into the system from the BLPs 26 via the tray transport mechanism and placed such that transport time of the trays is minimized (step 810). Step 610 in FIG. 6 shows an exemplary tray configuration after step 810 is executed.

Devices residing in the input trays are sorted out into output trays of specific category via the overhead pick and place mechanism (step 820). Trays are dynamically assigned categories as device categories are identified and the pick and place mechanism 28 place the devices into an output tray corresponding to the device category. (step 830). Devices grouped in a category greater than a preset number of categories X (in this example, X=6) are placed in the "Mixed" trays and held for later sorting (step 840, 850) The step labeled 620 in FIG. 6 shows an exemplary configuration of a series of trays after step 850 is complete. As shown in FIG. 6, a mixed tray (labeled "MIX") for holding several categories of devices may be dynamically assigned to a plurality of tray stations 22.

Trays of input parts are brought into the binning handler and full trays are removed from the binning handler. The category assignments of the tray stations 22 continue to be dynamically assigned based on device categories. Devices falling in categories 1-6 are sorted directly into trays, while devices from other categories are held in the mixed trays.

Once all devices falling into categories 1-6 have been sorted, empty trays are introduced into the binning handler. The empty trays are assigned categories corresponding to the device categories of the devices populating the mixed trays. (step 880). The devices contained in the mixed trays are sorted into the appropriate tray based on category (step 890). Step 640 of FIG. 6 shows an exemplary tray configuration where devices populating the mixed trays are placed in trays each having a category of 7, 8, 9, 10, 11, 12, 13 or 14.

This process applies not only to the use of a tray as a holding area for mixed devices, but to any other form of holding area which may be used for the same purpose. This area must be accessible via the machine mechanisms but may be inside or outside the machine. The method of the present invention, as described, allows categories of trays and devices to be dynamically created for optimum speed and flexibility.

Trays can be assigned to a category without delaying the device sorting process. Further the method of the present invention allows more categories to be sorted than there are tray locations available inside the machine.

The present invention can be used advantageously with semiconductor processing and handling equipment as described in commonly owned and co-pending provisional patent application entitled "LED Lighting System for Line Scan Camera Based Multiple Data Matrix Scanners" Ser. No. 60/666,307, filed on Mar. 30, 2005, herein incorporated by reference in its entirety and commonly owned and provisional co-pending patent application entitled "Machine Vision Based Scanner Using Line Scan Camera" Ser. No. 60/666,199, filed on Mar. 30, 2005 herein incorporated by reference in its entirety.

Although the invention has been described in reference to a particular embodiment, various other embodiments and modifications will be apparent to those skilled in the art. It is therefore intended that the foregoing description of a preferred embodiment be considered as exemplary only.

What is claimed is:

1. A method for sorting devices in automated handling equipment comprising:
   placing a plurality of output trays into a handler;
   placing a plurality of input trays containing a plurality of devices into the handler;
   sorting the plurality of devices in the plurality of input trays into the plurality of output trays, wherein the plurality of devices in the plurality of input trays are sorted into the plurality of output trays according to a category that is dynamically assigned to each output tray based on one or more device categories associated with the plurality of devices,
   wherein, if there are more device categories than output trays, categories are dynamically assigned to the plurality of input trays that are in the process of being emptied, and subsequently devices are sorted into the plurality of input trays according into their respective assigned category, and
   wherein, if there are not more device categories than output trays, devices are only sorted to the plurality of output trays; and
   removing output trays or input trays that are full with the plurality of sorted devices from the handler.

2. A method for sorting devices in automated handling equipment as claimed in claim 1, further comprising determining whether all of the devices have been sorted to an output tray or to an input tray.

3. A method for sorting devices in automated handling equipment as claimed in claim 1, further comprising identifying the category for each of the plurality of devices.

4. A method for sorting devices in automated handling equipment as claimed in claim 1, wherein input trays that have been emptied and that have not been assigned a category are removed from the handler.

5. A method for sorting devices in automated handling equipment as claimed in claim 1, wherein the input trays that are dynamically assigned a category and have device placed therein become output trays from the perspective of the automated handling equipment.

* * * * *